United States Patent
Wang et al.

(10) Patent No.: US 7,229,000 B2
(45) Date of Patent: Jun. 12, 2007

(54) ADJUSTABLE FRAME FIXTURE

(75) Inventors: Peng-Wei Wang, Kaohsiung (TW); Chun-Hsiung Chiu, Taoyuan Hsien (TW)

(73) Assignee: ASUSTeK Computer Inc., Taipei (TW)

( * ) Notice: Subject to any disclaimer, the term of this patent is extended or adjusted under 35 U.S.C. 154(b) by 297 days.

(21) Appl. No.: 10/925,007

(22) Filed: Aug. 25, 2004

(65) Prior Publication Data
US 2005/0067463 A1      Mar. 31, 2005

(30) Foreign Application Priority Data
Sep. 30, 2003    (TW) ................ 92127077 A

(51) Int. Cl.
*B23K 37/00*    (2006.01)
*B23K 37/04*    (2006.01)
(52) U.S. Cl. .................... 228/49.5; 228/47.1
(58) Field of Classification Search ............ None
See application file for complete search history.

(56) References Cited

U.S. PATENT DOCUMENTS

| | | | | |
|---|---|---|---|---|
| 4,291,867 A | * | 9/1981 | Williams et al. ......... | 269/43 |
| 4,948,108 A | * | 8/1990 | Sullivan ............... | 269/43 |
| 5,067,648 A | * | 11/1991 | Cascini ............... | 228/47.1 |
| 5,456,402 A | * | 10/1995 | Curtin ................ | 228/43 |
| 5,540,376 A | * | 7/1996 | Asla et al. ........... | 228/37 |
| 5,820,013 A | * | 10/1998 | Ortiz ................. | 228/43 |
| 5,897,108 A | * | 4/1999 | Gordon et al. ......... | 269/50 |
| 6,209,859 B1 | * | 4/2001 | Chung ................ | 269/111 |
| 6,237,832 B1 | * | 5/2001 | Chung ................ | 228/44.7 |
| 2005/0067464 A1 | * | 3/2005 | Wang et al. ........... | 228/49.5 |

\* cited by examiner

*Primary Examiner*—Lynne R. Edmondson
(74) *Attorney, Agent, or Firm*—Birch, Stewart, Kolasch & Birch, LLP

(57) ABSTRACT

An adjustable frame fixture aims to hold a printed-circuit board (PCB) to pass over a tin oven to process wave soldering. The fixture includes at least two side frames and at least two fasteners. The two side frames are coupled to form a holding dock. The positions of the two neighboring side frames are adjustable to form an area of different sizes to hold the PCB of different sizes. After the positions of the side frames have been adjusted, the fasteners are used to anchor and couple the side frames.

18 Claims, 5 Drawing Sheets

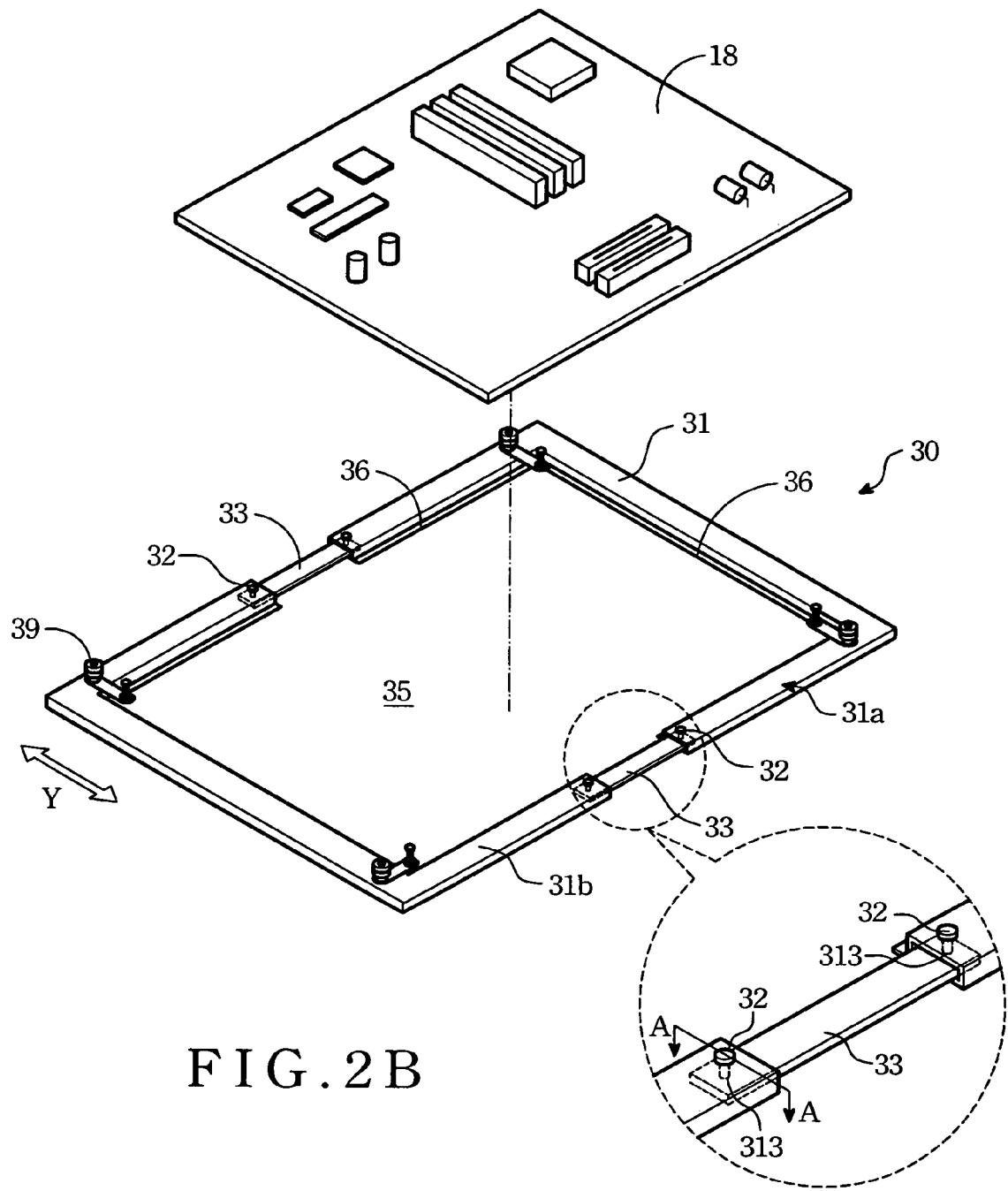
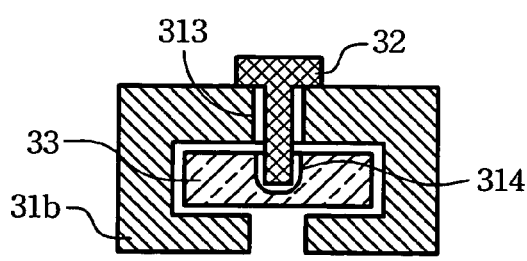

ADJUSTABLE FRAME FIXTURE

This Non-provisional application claims priority under 35 U.S.C. § 119(a) on Patent Application No(s). 092127077 filed in Taiwan, Republic of China on Sep. 30, 2003, the entire contents of which are hereby incorporated by reference.

FIELD OF THE INVENTION

The present invention relates to a frame fixture for holding a printed-circuit board (PCB) in the wave soldering process and particularly to an adjustable frame fixture for holding different sizes of PCBs.

BACKGROUND OF THE INVENTION

PCB is a substrate for installing and connecting various different electronic elements to accomplish a selected effect through interconnection of the different electronic elements. The most commonly used PCBs are main board, VGA card, wireless network card and the like. The commonly used electronic elements on the PCBs include chip set, capacitor, inductor, resistor and the like. Some of those electronic elements are mounted onto the PCB by surface mount technology (SMT), such as SMT elements; while some others are mounted onto the PCB by wave soldering, such as pin elements.

Wave soldering mainly employs a pump to generate an elongated tin wave on the surface of molten liquid-state tin in a tin oven, and the PCBs are carried by a conveyor belt in an inclined manner to pass over the tin oven to allow the liquid-state tin to be filled in the pin inlets of connection pin elements to form soldering points. The carrier holding the PCBs to pass over the tin oven for wave soldering is generally called frame fixture.

Refer to FIG. 1 for a conventional frame fixture 10. It is a rectangular structure consisting of four sides 12 and an opening 14 in the center. Each side 12 has a flange 16 extended from an inner edge. The edge of a PCB 18 may be rested on the flange 16 of each side 12. The upper surface of each side 12 has a plurality of clamp mechanisms 20 to apply a downward pressure on the upper surface of the PCB 18 so that the PCB 18 may be held and anchored firmly on the frame fixture 10.

However, the PCBs of different specifications have different shapes and sizes. In order to match different types of PCBs, the size of the frame fixture also should be changed. Due to the shape and size of conventional frame fixtures are not adjustable, once the specification of the PCB changes, the original frame fixture becomes useless.

Hence it becomes a waste of material of the frame fixture. Especially in the test stage of PCB design, the specification and dimension of the PCB frequently change for various reasons. As a result, the frame fixture for the PCB also has to change at the same time. Moreover, remaking the frame fixture takes a lot of time. In short, the dimension of the present frame fixture cannot be adjusted to match different specifications of PCBs, and results in waste of time and material resources.

SUMMARY OF THE INVENTION

The object of the invention is to provide an adjustable frame fixture with an adjustable dimension to suit and hold PCBs of different specifications to process wave soldering.

The adjustable frame fixture according to invention includes at least two side frames and at least two fasteners. The side frames are formed respectively in L-shape or reversed U-shape and are coupled with each other to form a holding dock to hold a PCB. Each of the side frames has at least one anchor hole formed in a desired shape such as ellipse. The fastener runs through the anchor hole to couple and fasten the neighboring side frames. By adjusting the positions of the two neighboring side frames, different sizes of area may be formed for holding different sizes of PCBs.

In one aspect, the frame fixture according to the invention further includes at least two coupling members interposed between the two neighboring side frames for connecting and fastening. The coupling member includes a second anchor hole to allow one fastener to run through to connect and fasten the neighboring side frames.

The anchor hole is a screw hole. The coupling member may be a screw, butterfly handle or anchor pin to engage with the anchor hole to achieve fastening effect. In addition, the side frame has a flange formed on an inner side thereof to hold the PCB. And the side frame further has a plurality of clamp structures (such as elastic reeds) to anchor the PCB.

For the PCB with SMT elements on the back side, the frame fixture according to the invention further includes a back soldering plate. The surface of the back soldering plate has carved out openings and masks. The masks cover the SMT elements, while the openings are to expose pins of DIP elements.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A, 2B and 2C are schematic views of a first embodiment of the adjustable frame fixture according to the invention.

DESCRIPTION OF THE PREFERRED EMBODIMENTS

Figure 1:
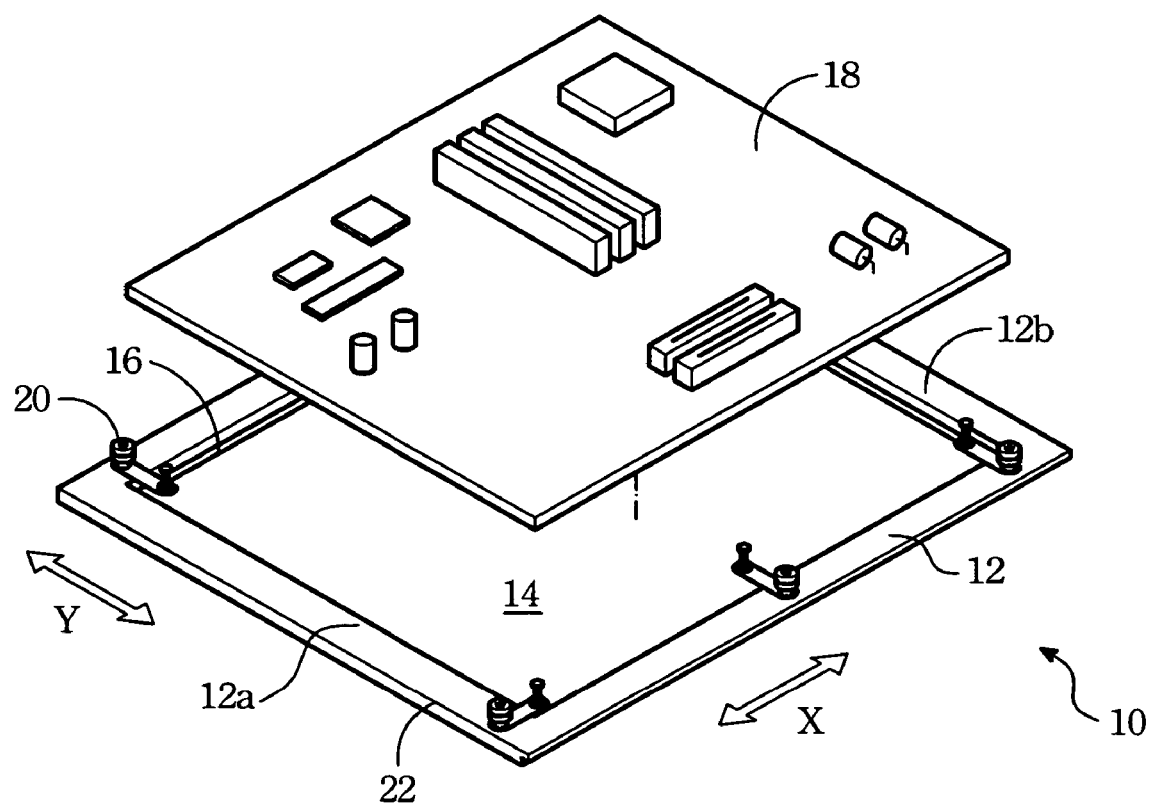
FIG. 1 is a schematic view of a conventional frame fixture.
Figure 2A:
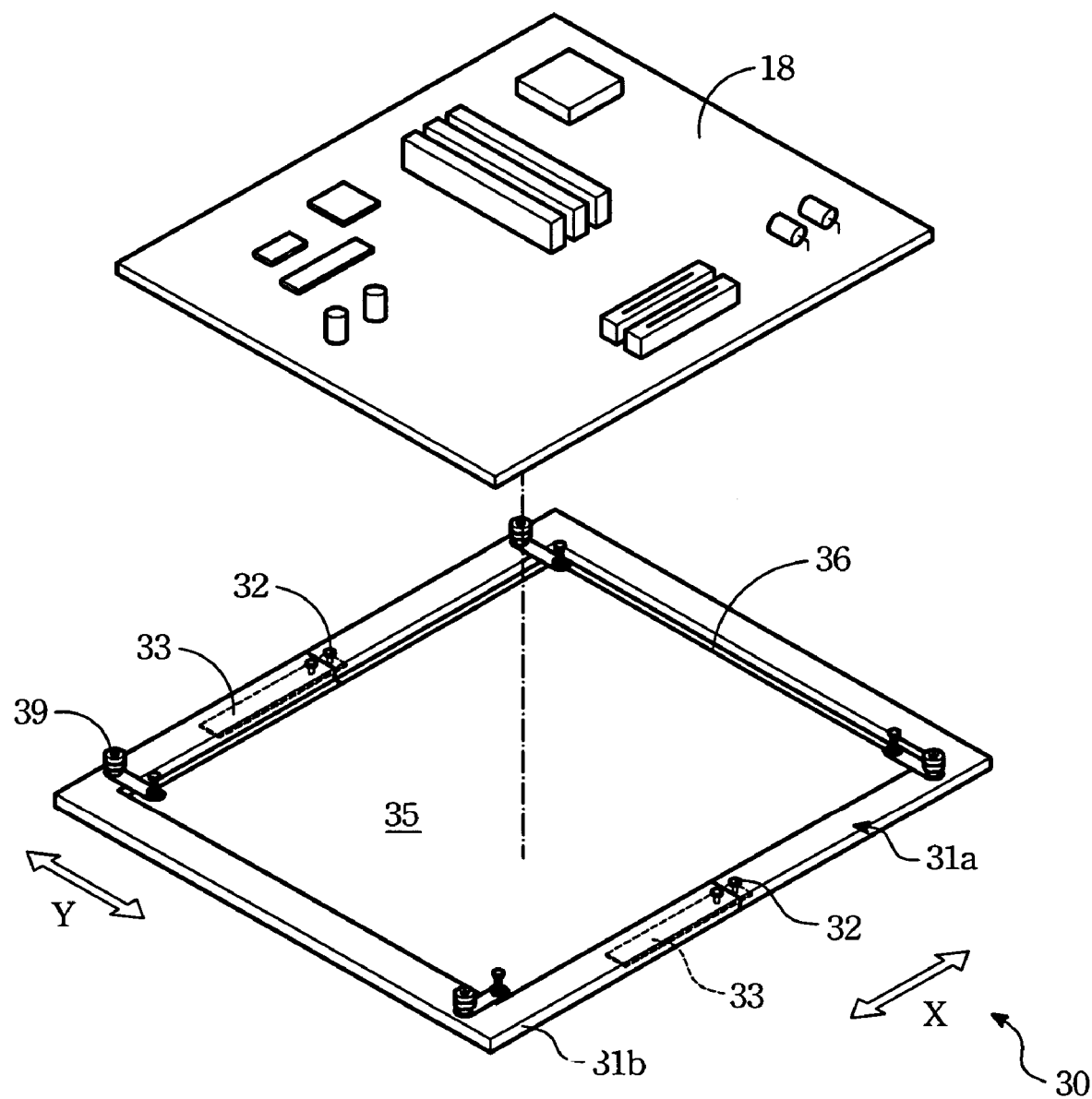

Refer to FIGS. 2A, 2B and 2C for a first embodiment of the adjustable frame fixture 30. It includes two side frames 31, two fasteners 32 and two coupling members 33.

The side frames 31 may be formed in reversed U-shape or L-shape to couple with each other to form a holding dock 35 to hold a PCB 18. The side frames 31 have anchor holes 313.

The fasteners 32 run through the anchor holes 313 to couple and fasten the neighboring side frames 31a and 31b.

The two coupling members 33 are located between the two neighboring side frames 31a and 31b for connecting and fastening the two. Each of the coupling members 33 has a second anchor hole 314. One fastener 32 may run through the second anchor hole 314 to connect and fasten the two neighboring side frames 31a and 31b.

By adjusting the positions of the two neighboring side frames 31a and 31b, the frame fixture 30 may be formed with a holding area of different sizes. And the side frames 31 may be anchored through the fasteners 32 to hold the PCB 18 of different sizes.

The anchor hole 314 may be a screw hole, while the fastener 32 may be a screw, butterfly handle or anchor pin. They may be coupled to achieve the fastening effect. In addition, the side frame 31 has an inner side with a flange 36 formed thereon to hold the PCB 18. The side frame 31 further has a plurality of clamp mechanisms 39 (such as elastic reeds) to anchor the PCB 18.

Figure 3A:
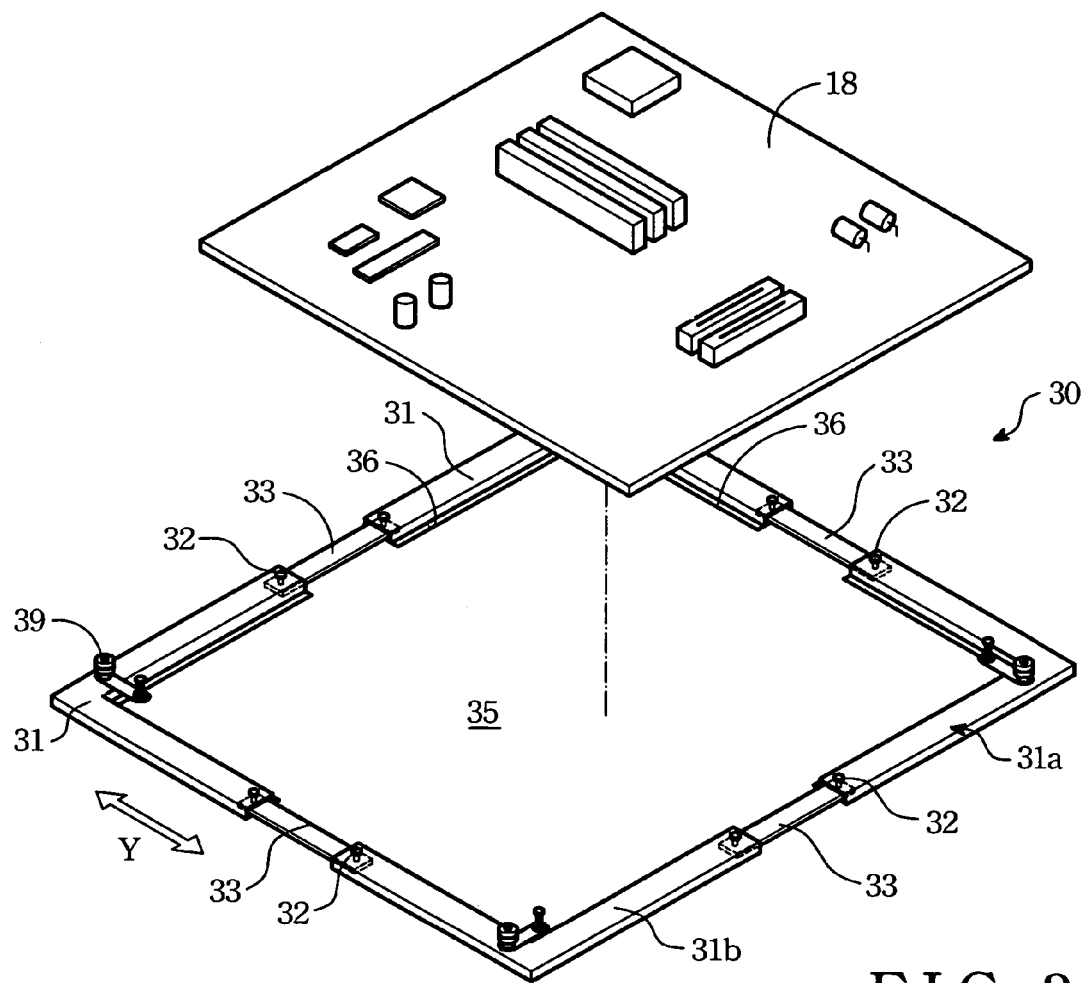
FIGS. 3A and 3B are schematic views of a second embodiment of the adjustable frame fixture according to the invention.

Refer to FIG. 3A for a second embodiment of the invention. The first embodiment depicted above provides dimension adjustment for only one direction (such as X direction), but cannot be adopted to two-direction adjustment. The second embodiment aims to provide a two-direction adjustable frame fixture 30. It has four side frames 31, eight fasteners 32 and four coupling members 33. The side frames 31 may be formed in L-shape or I-shape. The structure and function of the fasteners 32 and coupling members 33 are same as the first embodiment. Details are omitted.

Figure 3B:
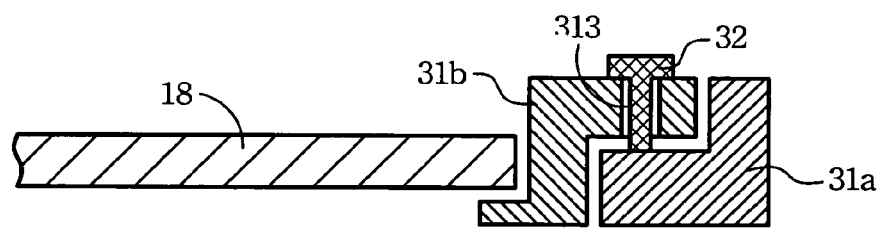

Refer to FIG. 3B for the cross section of two neighboring side frames according to the invention in a coupling condition. By means of the constructions set forth above, the frame fixture can provide dimension adjustment in two directions to hold the PCB of different sizes. It provides improved adaptability and applicability.

Figure 4A:
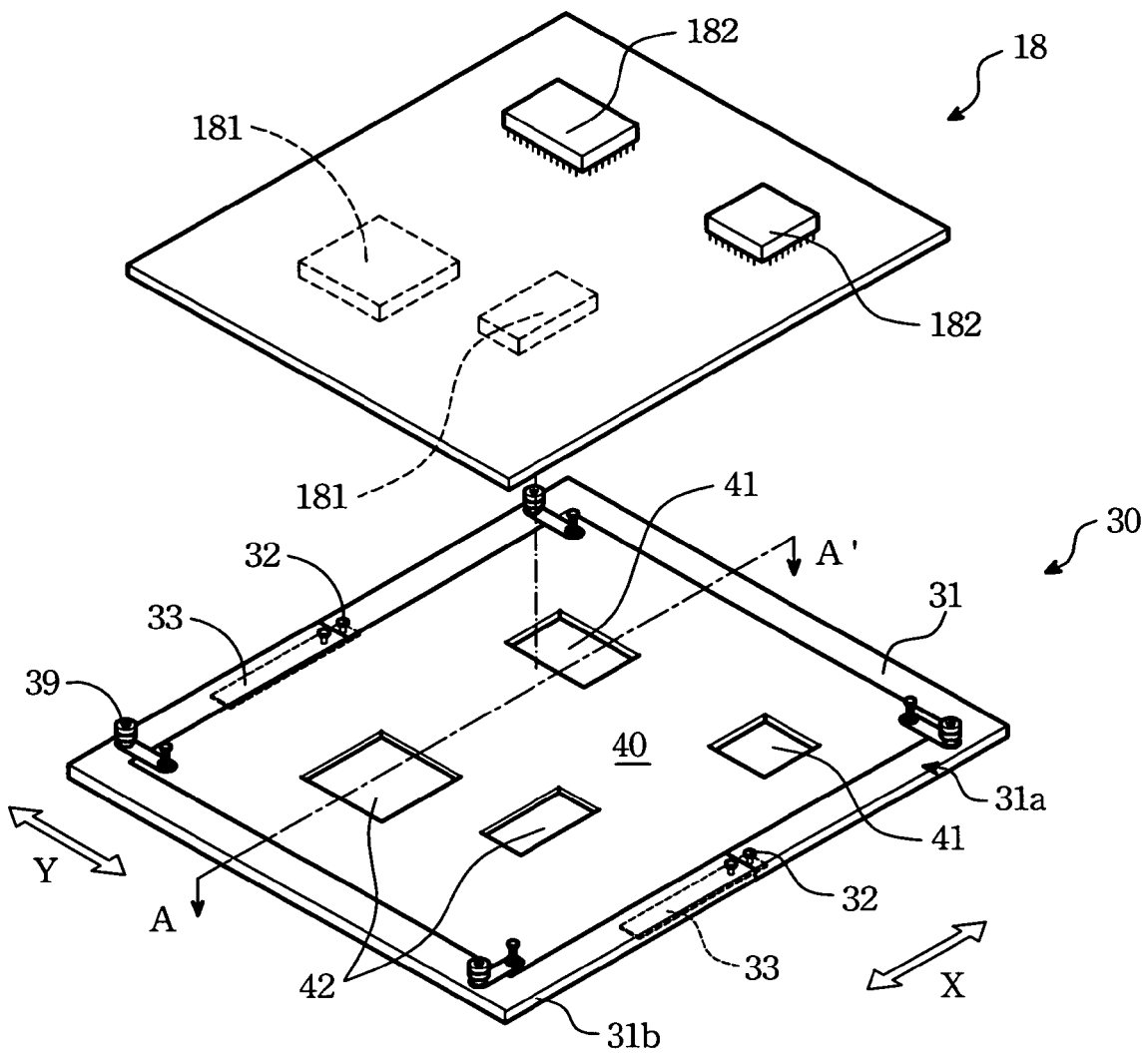
FIG. 4A is a schematic view of a third embodiment of the adjustable frame fixture according to the invention.
Figure 4B:
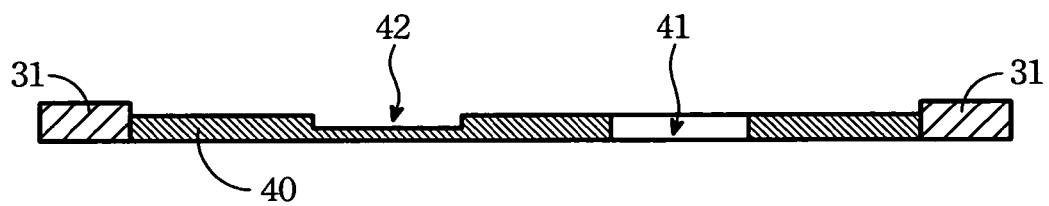
FIG. 4B is a cross section taken on line A–A' in FIG. 4A.

Refer to FIGS. 4A and 4B for a third embodiment of the invention. It aims at a PCB 18 with SMT elements 181 on the back side. The two previous embodiments are designed for the PCB without a back soldering plate. Hence when DIP elements 182 undergo wave soldering process, the SMT elements 181 will be damaged.

This embodiment provides an adjustable frame fixture 30 with a back soldering plate 40. The back soldering plate 40 has carved out openings 41 and masks 42 formed on the surface. The masks 42 are used to cover the SMT elements 181 of the PCB 18. The pins of the DIP element 182 are exposed to the openings 41. The other elements include side frames 31, fasteners 32 and coupling members 33, and are same as the previous embodiments. Details are omitted.

The adjustable frame fixture according to the invention may be adapted to PCBs of different specifications. Thus whatever design changes happened to the PCB specifications, the frame fixture of the invention is applicable without obsolete. There is also not material waste. This is especially valuable during the test stage of PCB design. As the PCB specification and dimension frequently change due to various reasons, the frame fixture of the invention may be altered at the same time to match the PCB dimension and specification. Thus it saves the time of remaking the frame fixture and improves product manufacturing efficiency.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A fixture for holding a printed-circuit board (PCB) to pass over a tin oven to process wave soldering, comprising:
   at least two side frames coupling with each other to form a holding dock, the side frames being abutted with adjustable positions to form an area of different sizes, wherein each side frame has an elastic reed for anchoring the PCB; and
   at least two fasteners for fastening and coupling the side frames.

2. The fixture of claim 1, wherein each of the side frames has at least one anchor hole to receive one of the fasteners to couple and anchor the abutting side frames.

3. The fixture of claim 2, wherein the anchor hole is elliptical.

4. The fixture of claim 2, wherein the anchor hole is circular.

5. The fixture of claim 2, wherein the anchor hole is a screw hole.

6. The fixture of claim 1, wherein the fastener is a screw.

7. The fixture of claim 1, wherein the fastener is a butterfly handle.

8. The fixture of claim 1, wherein the fastener is an anchor pin.

9. The fixture of claim 1 further having at least two coupling members for fastening the abutting side frames through the fasteners.

10. The fixture of claim 9, wherein each of the coupling members has at least one second anchor hole to receive one of the fasteners to couple and fasten the abutting side frames.

11. The fixture of claim 10, wherein the second anchor hole is elliptical.

12. The fixture of claim 10, wherein the second anchor hole is circular.

13. The fixture of claim 10, wherein the second anchor hole is a screw hole.

14. The fixture of claim 1, wherein the side frames is formed in reversed U-shape.

15. The fixture of claim 1, wherein the side frames is formed in L-shape.

16. The fixture of claim 1, wherein each of the side frames is formed in I-shape.

17. The fixture of claim 1, wherein the side frame has a flange for holding the PCB.

18. The fixture of claim 1, wherein the PCB has a back side bonding to at least one SMT element, the fixture further including a back soldering plate which has a surface forming at least one carved out opening for exposing pins of at least one DIP element and at least one mask for covering the SMT element.

* * * * *